United States Patent [19]
Dittmer

[11] Patent Number: 6,114,634
[45] Date of Patent: Sep. 5, 2000

[54] CIRCUIT BOARD LAYERS WITH IDENTIFICATION IMAGES

[75] Inventor: Ronald James Dittmer, West Dundee, Ill.

[73] Assignee: Motorola, Inc., Schaumburg, Ill.

[21] Appl. No.: 08/898,755

[22] Filed: Jul. 23, 1997

[51] Int. Cl.[7] ............................................. H05K 1/03
[52] U.S. Cl. ....................... 174/255; 174/250; 29/407.01; 29/407.1
[58] Field of Search .................................. 174/250, 255; 428/179, 195, 192, 209, 901; 29/407.01, 407.09, 407.1

[56] References Cited

U.S. PATENT DOCUMENTS

| | | | |
|---|---|---|---|
| 3,272,909 | 9/1966 | Bruck et al. | 174/68.5 |
| 5,093,183 | 3/1992 | Strunka | 428/195 |
| 5,266,380 | 11/1993 | Renguso et al. | 428/192 |

*Primary Examiner*—Jeffrey Gaffin
*Assistant Examiner*—Kamand Cuneo
*Attorney, Agent, or Firm*—Terri S. Hughes; Romi N. Bose

[57] ABSTRACT

A circuit board (110) has a layer window (100) through which images (120–170) on transparent layers can be seen. An inspector of the board can determine if the layers have been placed properly if the images (120–170) are in a unidirectional step formation away from the outer layer. The visual inspection is further enhanced by forming the images with overlapping curvatures (180) at their ends.

12 Claims, 2 Drawing Sheets

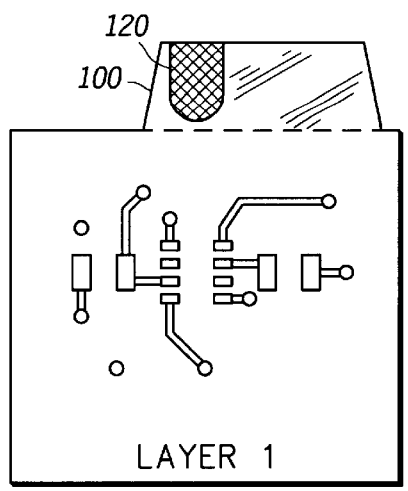
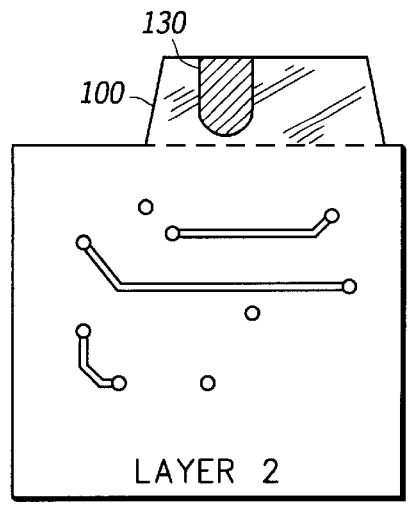
FIG.1A  FIG.1B
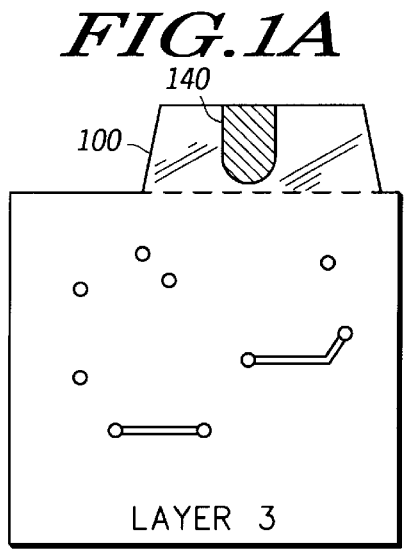
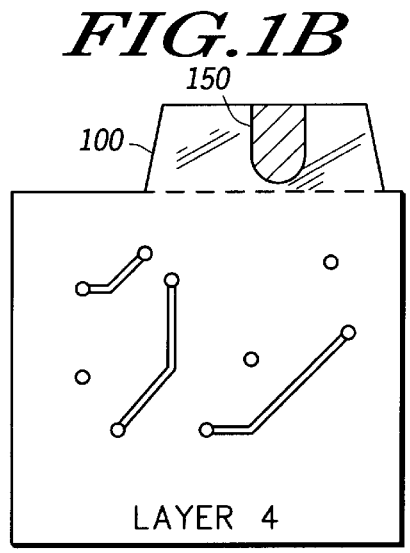
FIG.1C  FIG.1D
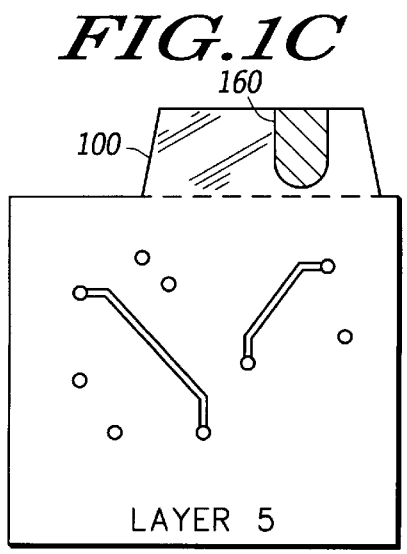
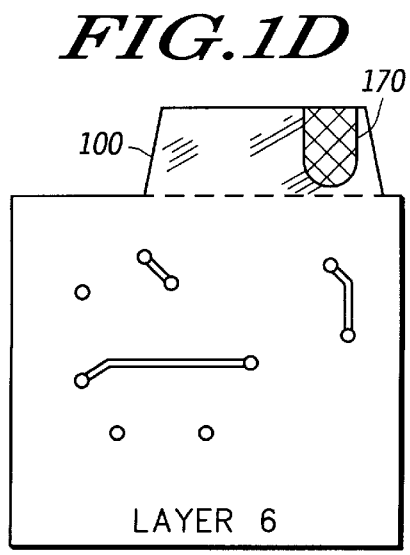
FIG.1E  FIG.1F

CIRCUIT BOARD LAYERS WITH IDENTIFICATION IMAGES

FIELD OF THE INVENTION

The present invention relates generally to multi-layer circuit boards, and in particular, to detecting a proper assembly (or stacking) of conductive layers that make up the structure of the circuit board.

BACKGROUND OF THE INVENTION

Multi-layer circuit boards include boards such as PUBS (printed circuit board), PWBs (printed wiring boards), and flex circuits. Boards that are etched rather than printed are also included with the definition of multi-layer circuit boards.

Multi-layer circuit boards are made up of layers of semi-transparent insulating material such as FR-4 or Getek, having circuitry processed thereon. Generally the circuitry is copper although other conducting material can be used.

Circuit patterns are generated on conductive cladded sheets of transparent insulating material. The sheets are then stacked, aligned and bonded to create a multi-layer circuit board.

A problem that can occur with circuit board fabrication is that the conductive layers are processed out of sequence than what was designed. For instance, a circuit board comprised of 6 conductive layers could have a required stacking sequence of 1 2 3 4 5 6. A fabricator could mistakenly place the order as 1 4 5 3 2 6. Even though the layers are out of order as designed, the board might generally perform most, if not all, of the functions the circuitry was designed for. This is due to the fact that connection points among all the layers are generally designed at the same point on the board. Although all electrical tests would test the circuit board as GOOD, in fact the rearrangement could cause unusual characteristics that would be undetectable to typical test equipment.

An example of affects on the circuit board not readily detected by typical test equipment is a dedicated internal Ground plane which must be adjacent to a dedicated internal Power plane. This creates a much needed capacitance within the circuit board. Switching the layers would remove the Ground plane away from the Power plane eliminating the capacitance. Another example is the creation of a radio frequency transmission or strip line. In these examples, a copper pattern on one layer requires a specific distance to another Ground plane layer. Changing the placement of the layers changes the distance needed for the proper frequency in the radio transmission or in the strip line.

If the placement of the layers is wrong, the result of the circuit boards of the two above examples would be that the circuit boards perform outside their designed specifications. These types of requirements are very difficult to test for. Accordingly, testing for this type of performance is not done and is assumed to be correct if other testing proves within design parameters.

A finished circuit board normally looks "correct" whether the internal conductive layers are placed properly or not. Visual inspection of such boards to detect misplacement requires a very trained eye for specific circuit details which would probably not be available to the board fabrication house, inspectors of the boards, or factory staff. Accordingly, there is a need to provide a simplified method of allowing fabricators and factory inspectors to determine visually, through some type of layer inspection window (sometimes referred to as a coupon), if the layers have been placed properly.

Attempts have been made to provide a means of visually inspecting the arrangement of the layers through placing various patterns on the layers which can be seen in a layer window. Since the insulating material is transparent, numbers or shapes have been added to each layer for inspection of the construction through depth comparison. Unfortunately, the eye cannot easily distinguish the depth of shapes or images through the transparent layers. As the layers deepen, the difference in depth of the image(s) becomes difficult if not impossible to determine.

Accordingly, a means to visually detect quickly whether the layers of the printed circuit board are properly placed as designed is needed.

BRIEF DESCRIPTION OF THE DRAWINGS

FIGS. 1A–1G are diagrams of a circuit board layers having windows with images according to a preferred embodiment of the present invention.

DETAILED DESCRIPTION OF A PREFERRED EMBODIMENT

Figure 1G:
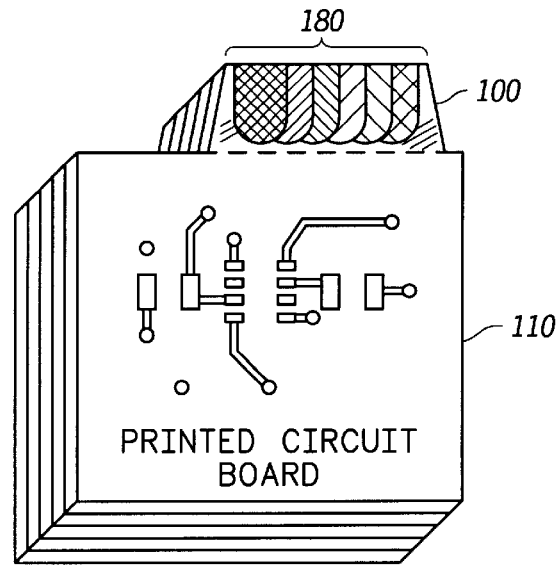

FIGS. 1A–1G show a circuit board layer window 100 of a circuit board 110 according to the preferred embodiment of the present invention. In the circuit board example shown in FIGS. 1A–1G there are 6 layers represented. On each of these layers is applied or included an image (120 through 170) in a designated location in the layer window 100. In the example of FIGS. 1A–1G, image 120 is associated with layer 1, image 130 with layer 2, image 140 with layer 3, image 150 with layer 4, image 160 with layer 5, and image 170 with layer 6. The circuit board 110 is shown as having each of the layers 1 through 6 applied or placed in their predetermined proper order. When the layers are properly ordered, the transparent nature of the layers 1 through 6 allow an inspector to see if the images 120 through 170 partially overlap when stacked to appear as a stair-step configuration. If the overlap of the images appears to continuously progress in the direction away from the image on the window of the top circuit board layer, then the layers were placed in proper order. The advantage of the stair-step formation over other methods of visual inspection is the step formation allows an inspector to visualize each layer with respect to the other layers. For instance, if one of the layers is out of order, the step formation allows the inspector to see that the direction of the steps is interupted. The overlapping nature of the images in the preferred embodiment make the directional step formation even more clear at a glance.

The preferred embodiment of the present invention of FIGS. 1A–1G shows each of the images (120)–(170) having a semi-circle 180 at the end of the image. Empirically it has been determined that the semi-circle at the end of the image, or an image having a curvature which overlaps with the other images, supplies the best means for determining if the images are layered in a one-directional step formation.

Although the preferred embodiment shows images 120 through 170 as having overlapping curvatures (180), any image in step formation, particularly in overlapping step formation, falls within the scope of the present invention.

Figure 2:
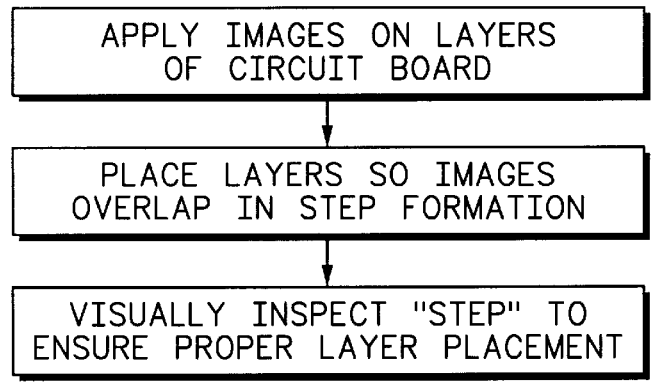
FIG. 2 is a flow diagram of a method of visually inspecting proper placing of the layers of a circuit board according to a preferred embodiment of the present invention.

FIG. 2 is a flow diagram of the method of allowing visual inspection of the circuit board to assure proper placing of the layers. Each of the layers have images included thereon (210). The images are designed on the layers of the printed circuit board in a location that when the layers are properly aligned, they overlap and form the step formation. The layers are then combined in what is expected to be their proper order forming the overlapping step formation (220). This formation is the means for allowing an inspector to visually inspect the layer window 100 to determine if the step information appears to continuously progress in a direction away from the image on the window of the top circuit board layer such that the images are staggered evenly without duplicated overlap or empty spaces where an image is expected (230).

Figure 3:
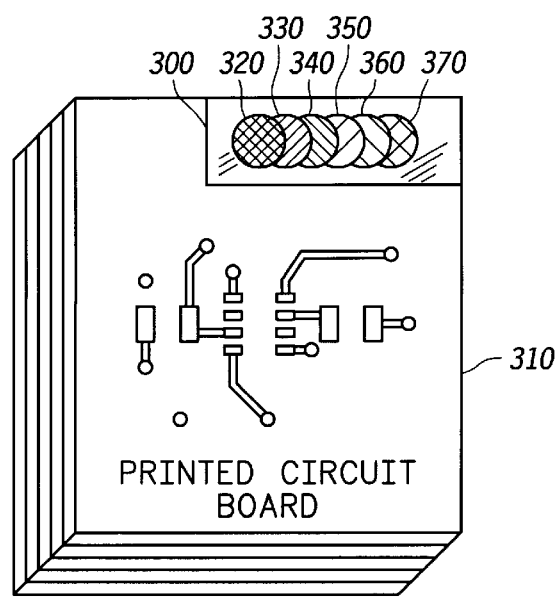
FIG. 3 is a diagram of stacked circuit board layers having windows with images according to another embodiment of the present invention.

FIG. 3 shows another embodiment of the present invention. In FIG. 3, images 320 through 370 (correlating to images 120 through 170 of FIG. 1) are shown as circles. This allows layer window 300 to be much smaller in size, and facilitates placing layer window along the edge of circuit board 310.

As mentioned above, previous attempts to perform visual inspection of the ordering of the layers of a circuit board have been relatively unsuccessful. This is because the images used have not formed a step formation, and in particular an overlapping step formation, which results in substantial difficulty in determining the location of the images in relation to all the other images and in relation to the outer layer. By stepping the images, and particularly overlapping images having curvatures, an inspector can readily determine if the circuit board has been constructed properly.

What is claimed is:

1. A circuit board comprising a number of images, each of the number of images viewable on each one of a number of circuit board layers, the number of images overlapping to form a step formation when all of the circuit board layers are combined to form the circuit board.

2. A circuit board according to claim 1 wherein the number of images includes means for determining that the step formation is continuously progressing away from an outer layer of the circuit board.

3. A circuit board according to claim 2 wherein the images have a curved shape.

4. A circuit board according to claim 3 wherein the curved shape is semi-circular.

5. A circuit board according to claim 3, wherein the curvature pattern is circular.

6. A method comprising the steps of:

applying images onto one or more designated locations of a number of layers of a circuit board wherein each of the layers has one of the number of images applied thereon at a designated location; and combining the layers to form the circuit board wherein the images overlap to form a step formation to assure proper placement of the layers through visual inspection.

7. A method according to claim 6 wherein the step of combining the layers comprises stacking the layers to place the images in a step formation.

8. A circuit board comprising a number of layers, each of the number of layers having a predetermined image placed thereon to allow visual inspection of proper placement of the number of layers when the number of layers are combined, the images overlapping to form a step formation which continuously progresses in a single direction from an outer one of the number of layers.

9. A circuit board according to claim 8, wherein the shape of each image of the number of layers is a semi-circle.

10. A circuit board according to claim 8 wherein the shape of each image of the number of layers includes a curvature.

11. A method comprising combining layers of a circuit board in a predetermined order, each of the layers having a viewable image thereon, the images overlapping to form a step formation progressing in a direction away from an outside one of the layers when the layers are combined in the predetermined order.

12. A method according to claim 11, further comprising determining that the layers are in the predetermined order by visual inspection.

* * * * *